(12) United States Patent
Choo et al.

(10) Patent No.: US 6,230,788 B1
(45) Date of Patent: May 15, 2001

(54) HEAT SINK

(75) Inventors: Kok Fah Choo; Chang Yu Liu; Yew Wah Wong; Weng Kong Chan; Kwok Woon Tou, all of Singapore (SG)

(73) Assignee: DSO National Laboratories (SG)

( * ) Notice: Subject to any disclaimer, the term of this patent is extended or adjusted under 35 U.S.C. 154(b) by 0 days.

(21) Appl. No.: 09/524,813

(22) Filed: Mar. 14, 2000

Related U.S. Application Data

(62) Division of application No. 08/996,014, filed on Dec. 22, 1997, now Pat. No. 6,062,299.

(30) Foreign Application Priority Data

Jul. 8, 1997 (SG) ................................................... 9702399

(51) Int. Cl.[7] ....................................................... F28F 7/00
(52) U.S. Cl. ................. 165/46; 165/104.33; 165/104.32; 165/104.14; 174/16.3; 257/715; 361/700
(58) Field of Search ................. 165/46, 104.21, 165/104.27, 104.32, 104.33, 104.14; 257/715, 714; 361/700; 174/16.3

(56) References Cited

U.S. PATENT DOCUMENTS

| | | |
|---|---|---|
| 3,461,952 | 8/1969 | Decker et al. . |
| 4,009,417 | 2/1977 | Waldon et al. ........................ 361/38 |
| 4,009,418 | 2/1977 | Bennett ................................. 361/38 |
| 4,341,000 | 7/1982 | Stockman .......................... 29/157.3 |
| 4,704,658 | 11/1987 | Yokouchi et al. .................. 361/385 |
| 4,912,548 | 3/1990 | Shanker et al. ....................... 357/82 |
| 5,000,256 | 3/1991 | Tousignant ............................ 165/46 |
| 5,198,889 | 3/1993 | Hisano et al. ....................... 257/678 |
| 5,245,508 | 9/1993 | Mizzi ................................. 361/694 |
| 5,560,423 | 10/1996 | Larson et al. .................. 165/104.26 |
| 5,660,229 | 8/1997 | Lee et al. ........................ 165/104.26 |
| 5,704,416 | 1/1998 | Larson et al. .................. 165/104.33 |

FOREIGN PATENT DOCUMENTS

| | | |
|---|---|---|
| 0059581 | 9/1982 | (EP) . |
| 0201652 | 5/1985 | (EP) . |
| 5599586 | 7/1980 | (JP) . |
| 364950 | 3/1989 | (JP) . |

OTHER PUBLICATIONS

Parsapour, H.B., "Convection Cooling in Small Terminals," IBM Technical Disclosure Bulletin, vol. 24, No. 2, Jul. 1981.

*Primary Examiner*—Christopher Atkinson
(74) *Attorney, Agent, or Firm*—Stoel Rives LLP

(57) ABSTRACT

A heat sink comprising: a body having an envelope including a flexible portion for thermal contact with a heat source, the envelope being filled with a thermally conductive liquid; and a thermosyphon having one end disposed at least partly within the liquid in the body to absorb heat from the heat source and another end disposed outside the envelope to dissipate heat.

20 Claims, 3 Drawing Sheets

HEAT SINK

This application is a divisional of U.S patent application Ser. No. 08/996,014, filed Dec. 22, 1997, now U.S. Pat. No. 6,062,299.

THIS INVENTION relates to a heat sink and more particularly to a heat sink for cooling a heat source such as electronic components mounted on a printed circuit board.

The trend in the development of electronic devices is for heat generating components to be assembled in high packaging densities on printed circuit boards (PCBs). Therefore, the heat to be dissipated at both component and PCB levels has increased tremendously and conventional free or forced air convection cooling techniques have reached their maximum cooling capacity. Since the external surfaces of heat generating components mounted on a PCB are not always in the same plane, cooling all the components on a PCB by a single solid heat sink, such as a heat pipe, is very difficult.

Heat sinks with flexible surfaces have been proposed. The main objective for such heat sinks is to cool individual electronic components. Heat sinks incorporating flexible containers for cooling multiple electronic components have also been proposed. However, the cooling capacities of such designs are limited since no effective method has been proposed for dissipating the heat absorbed by a liquid inside the flexible container.

It is an object of the present invention to provide an improved method for cooling heat generating electronic components mounted on PCBs.

Accordingly, the present invention provides a heat sink comprising: a body having an envelope including a flexible portion for thermal contact with a heat source, the envelope being filled with a thermally conductive liquid; and a thermosyphon having one end disposed at least partly within the liquid in the body to absorb heat from the heat source and another end disposed outside the envelope to dissipate heat.

In order that the present invention may be more readily understood, embodiments thereof will now be described, by way of example, with reference to the accompanying drawings, in which.

Referring to the figures, a heat sink 1 embodying the present invention has a body 2 for engagement with heat generating components on at least one printed circuit board, a series of thermosyphons, or heat pipes, 3 and an array of cooling fins 4 mounted on the thermosyphons 3.

Figure 1:
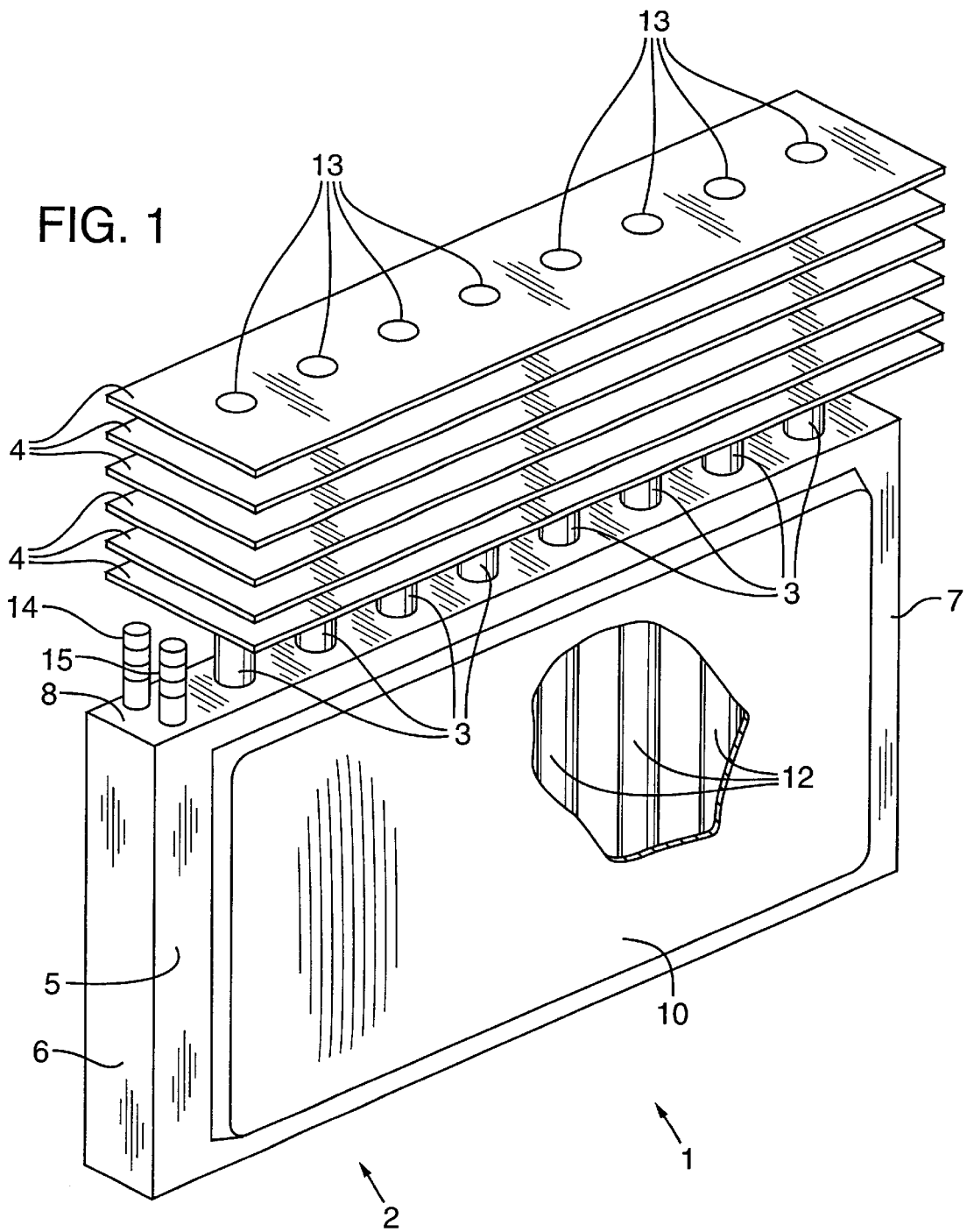
FIG. 1 is a perspective view of a heat sink embodying the present invention, a cut-away portion illustrating the interior of a section of the heat sink.
Figure 2:
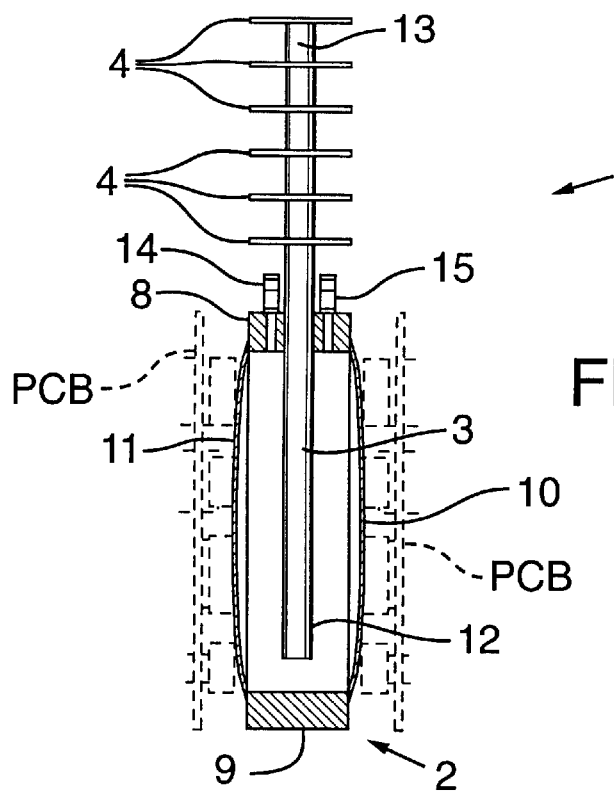
FIG. 2 is a schematic side view, partially in cross-section of the heat sink of FIG. 1, two PCBs being shown in phantom either side of the heat sink.

Referring to FIGS. 1 and 2, the body 2 comprises a substantially rectangular frame 5 made up of side walls 6, 7, a top wall 8 and a base 9. Two flexible membranes 10, 11 are attached to the frame 5 to create a volume within the body 2 which is enclosed by the side walls 6, 7, the top wall 8, the base 9 and the flexible membranes 10, 11. The flexible membranes 10, 11 are made from a flexible material having high thermal conductivity such as, for example, laminated aluminum foil or a 3M proprietary multi-layer film as used in 3M's liquid heat sink.

The top wall 8, is formed with a series of equispaced holes along its length each of which receives in friction fit and sealing engagement a thermosyphon 3. The end of the thermosyphon 3, inside the body 2, is known as the evaporator portion 12. The evaporator portion 12 generally establishes a plane that bisects the body 2. The opposite end of the thermosyphon 3, which is located outside of the body 2 is known as the condenser portion 13. Each thermosyphon 3 is filled with a working fluid such as water.

The top wall 8 of the frame 5, is also provided with a pair of valves 14, 15, which are used to charge and pressurize a thermally conductive and electrically non-conductive liquid which can be introduced into the body 2. Valves 14 and 15 are perferably positioned on opposite sides of the plane of evaporator portion 12 that generally bisects the body 2. Preferably, the liquid in the body is 3M's Fluorinert (Trade Mark) liquid.

One of the valves 14 is used to bleed air or the like from the body 2 as the body 2 is being filled with liquid through the other of the valves 15. The condenser portions 13 of the thermosyphons 3 support the array of cooling fins 4. Each fin 4 comprises a rectangular plate manufactured from a thermally conductive material such as copper. The fins 4 are spaced apart from one another to maximize the surface area which they present to promote efficient cooling.

In operation, the body 2 of a heat sink 1 embodying the present invention is sandwiched between two PCBs upon which are arranged an array of heat generating components requiring cooling. As shown in FIG. 2, the components on the PCBs face inwardly towards the body 2 of the heat sink 1.

The volume inside the body 2 is filled through one of the valves 14, 15 with the thermally conductive liquid. When filled, the liquid in the body 2 is then pressurized through one of the valves 14, 15 so that the flexible membranes 10, 11 expand to make good thermally conductive contact with the irregular surfaces presented by the electronic components on both the PCBs. In this manner, the maximum surface area of the electronic components on the PCBs is in contact with the surfaces of the thermally conductive membranes 10, 11 even though the components on the PCB are not necessarily all in the same plane. Preferably, the flexible membranes 10, 11 are coated with a thermally conductive gel to enhance the thermal conductivity between the components and the membranes 10, 11.

Figure 3:
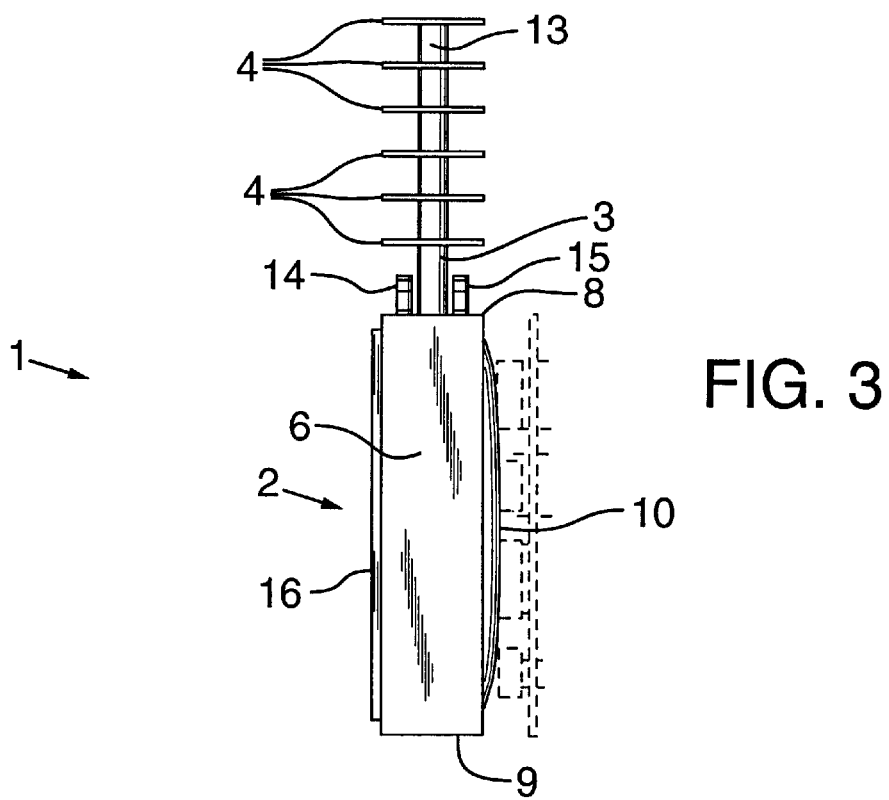
FIG. 3 is a schematic side view of another heat sink embodying the present invention, a single PCB being shown in phantom on one side of the heat sink.
Figure 4:
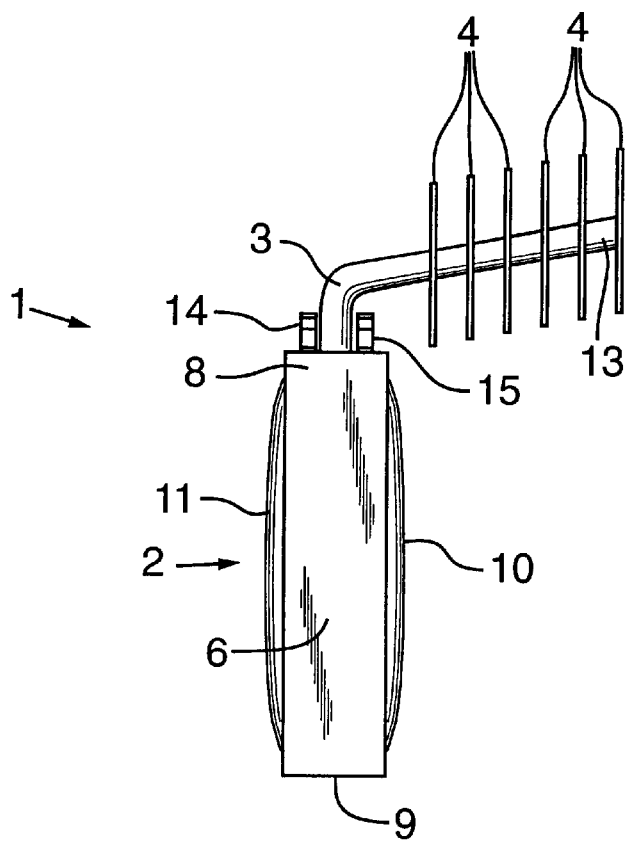
FIG. 4 is a schematic side view of a further heat sink embodying the present invention for use in cooling two PCBs.
Figure 5:
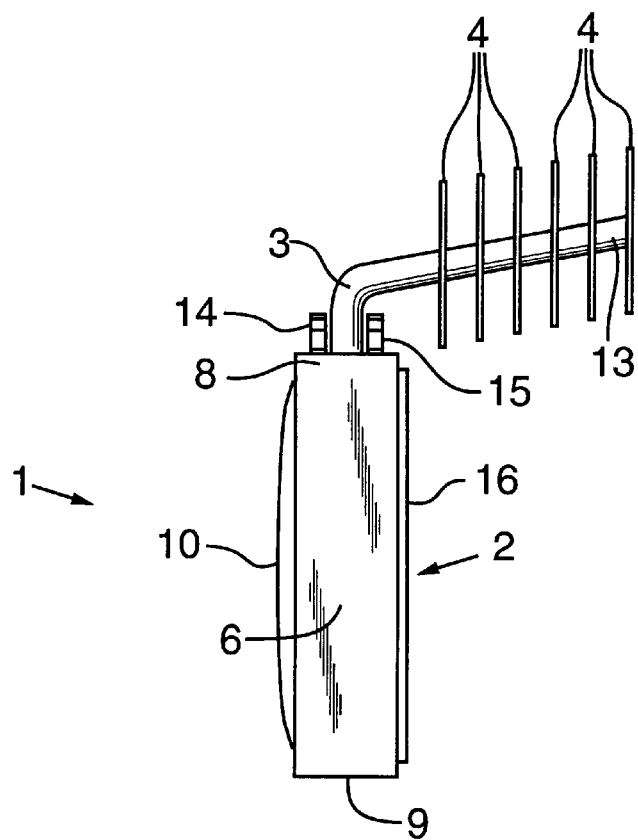
FIG. 5 is a schematic side view of another heat sink embodying the present invention for use in cooling a single PCB.

As the PCB components heat up, heat is conducted through the membranes 10, 11 to the liquid inside the body 2 which absorbs this heat and transmits the heat to the evaporator portions 12 of the thermosyphons 3. In forced convection embodiments of the invention, as shown in FIGS. 1 to 3 and in free convention embodiments of the invention as shown in FIGS. 4 and 5, as the evaporator portions of the thermosyphons 3 heat up, evaporation of the working fluid inside the thermosyphons 3 is caused, causing the vapour to move up the thermosyphons 3 towards the condenser portions 13. As the vapour reaches the condenser portions 13 of the thermosyphons 3, the heat of the working fluid is conducted to the fins 4. In both forced and free convection embodiments, the heat from the condenser portions 13 is radiated outwardly via the cooling fins 4 to the atmosphere by forced air convection or free convection.

A variation on the embodiment of the heat sink shown in FIGS. 1 and 2 is shown in FIG. 3. In this embodiment, one of the flexible membranes 11, is removed from the body 2 and substantially planar rigid metal plate 16, that is opposite the remaining flexible membrane 10 and transverse to top wall 8. This embodiment is particularly well suited to cooling the components of a single PCB, the components of the PCB being placed in contact with the remaining flexible membrane 10.

The embodiments of the heat sink shown in FIGS. 1, 2 and 3 are particularly well suited to cooling by forced air convection whereas the embodiments shown in FIGS. 4 and 5 are particularly well suited to cooling by free convection. In the embodiments shown in FIGS. 4 and 5, the thermosyphons 3 are bent through 85° and the fins 4 are mounted vertically, i.e. parallel with the evaporator portions 12, within the body 2 so that heat is dissipated from the fins freely. The embodiment shown in FIG. 4 is particularly well suited for cooling two printed circuit boards, whereas the embodiment shown in FIG. 5 is particularly well suited for cooling a single PCB, one of the flexible membranes 11 being removed and replaced by a rigid metal plate 16.

When the heat sink body 2 is to be removed from between the PCBs, the body is simply depressurized by opening one of the valves 14, 15 to bleed off air and/or liquid to allow the flexible membrane or membranes 10, 11 to collapse away from the PCB(s).

It will be obvious to those having skill in the art that various changes may be made in the details of the above-described embodiments of the present invention without departing from the principles thereof. The scope of the present invention should, therefore, be determined only by the following claims.

What is claimed is:

1. A heat sink comprising:
    a body having an envelope including two flexible portions for thermal contact with a heat source located on opposite sides of the envelope and an upper surface that is generally transverse to the flexible portions, the envelope being filled with a thermally conductive liquid;
    a thermosyphon having multiple evaporator portions disposed at least partly within the liquid in the body to absorb heat from the heat source and multiple condenser portions disposed outside the envelope and extending from the upper surface to dissipate heat;
    a first valve located on the body through which the liquid is charged into the envelope to come into contact with all of the evaporator portions; and
    a second valve located on the body through which vapor is discharged out of the envelope and away from all of the evaporator portions, such that the envelope is capable of being filled with liquid through the first valve while the vapor is eliminated through the second valve.

2. A heat sink according to claim 1, wherein at least one of the flexible portions is made from a thermally conductive material.

3. A heat sink according to claim 1, wherein at least one of the flexible portions comprises a flexible membrane.

4. A heat sink according to claim 3, wherein at least one of the flexible portions is mounted on a frame.

5. A heat sink according to claim 4, wherein the frame and at least one of the flexible portions are electrically non-conductive.

6. A heat sink according to claim 1, wherein a plurality of thermosyphons are provided.

7. A heat sink according to claim 1, wherein a cooling fin is attached to the thermosyphon outside the envelope.

8. A heat sink according to claim 1, wherein at least one of the flexible portions is positioned against multiple electrical components on a PCB, the multiple electrical components having irregular surfaces in different planes.

9. A heat sink according to claim 1, wherein the first or second valve is disposed outside the envelope above the upper surface.

10. A heat sink according to claim 1, wherein the evaporator portions generally bisect the body.

11. A heat sink according to claim 1, wherein the evaporator portions generally bisect the body and wherein the first and second valves are disposed outside the envelope, extending from the upper surface, and on opposite sides of the evaporator portions.

12. A heat sink according to claim 1, wherein the first and second valves are separately connected to the body.

13. A heat sink according to claim 1, wherein the thermosyphon is adapted to contain a working fluid that is separated from the thermally conductive liquid in the body.

14. A heat sink according to claim 1, wherein the envelope is pressurized through the first valve and depressurized through the second valve.

15. A heat sink according to claim 1, wherein all of the vapor is bled from the envelope when the envelope is filled with liquid.

16. A heat sink according to claim 2, wherein at least one of the flexible portions comprises a flexible membrane.

17. A heat sink according to claim 5, wherein the evaporator portions generally bisect the body.

18. A heat sink according to claim 5, wherein the evaporator portions generally bisect the body and wherein the first and second valves are disposed outside the envelope, extending from the upper surface, and on opposite sides of the evaporator portions.

19. A heat sink according to claim 13, wherein the first and second valves are separately connected to the body.

20. A heat sink according to claim 11, wherein the thermosyphon is adapted to contain a working fluid that is separated from the thermally conductive liquid in the body.

* * * * *